(12) United States Patent
Hsu et al.

(10) Patent No.: US 11,257,947 B2
(45) Date of Patent: Feb. 22, 2022

(54) METAL OXIDE SEMICONDUCTOR FIELD EFFECT TRANSISTOR AND METHOD FOR MANUFACTURING THE SAME

(71) Applicant: Cystech Electronics Corp., New Taipei (TW)

(72) Inventors: Hsin-Yu Hsu, New Taipei (TW); Yung-Chang Chen, New Taipei (TW); Chen-Huang Wang, New Taipei (TW)

(73) Assignee: CYSTECH ELECTRONICS CORP., New Taipei (TW)

( * ) Notice: Subject to any disclaimer, the term of this patent is extended or adjusted under 35 U.S.C. 154(b) by 32 days.

(21) Appl. No.: 16/866,743

(22) Filed: May 5, 2020

(65) Prior Publication Data

US 2021/0351291 A1 Nov. 11, 2021

(51) Int. Cl.
*H01L 29/78* (2006.01)
*H01L 29/10* (2006.01)
*H01L 21/283* (2006.01)
*H01L 29/06* (2006.01)

(52) U.S. Cl.
CPC ........ *H01L 29/7813* (2013.01); *H01L 21/283* (2013.01); *H01L 29/0623* (2013.01); *H01L 29/1095* (2013.01)

(58) Field of Classification Search
CPC ............. H01L 29/0623; H01L 29/7813; H01L 21/283; H01L 29/1095
See application file for complete search history.

(56) References Cited

U.S. PATENT DOCUMENTS

2014/0027840 A1* 1/2014 Guan .................. H01L 29/0623
257/330
2019/0288083 A1* 9/2019 Hsu ..................... H01L 29/0623

FOREIGN PATENT DOCUMENTS

TW 201011835 A 3/2010
TW 201939753 A 10/2019

* cited by examiner

*Primary Examiner* — Joseph C. Nicely
(74) *Attorney, Agent, or Firm* — Li & Cai Intellectual Property (USA) Office

(57) ABSTRACT

A metal oxide semiconductor field effect transistor and a method for manufacturing the same are provided. The metal oxide semiconductor field effect transistor includes a substrate structure, doped regions, an oxide layer structure, semiconductor layer structures, a dielectric layer structure, and a metal structure. The substrate structure includes a base layer and an epitaxial layer. The epitaxial layer forms a plurality of trenches along a first direction. Any two adjacent trenches form a pitch therebetween, and the pitches formed between the trenches are increased along the first direction. The doped regions are formed at bottoms of the trenches. The oxide layer structure is formed on inner walls of the trenches and a surface of the epitaxial layer. The semiconductor layer structures are respectively formed in the trenches. The dielectric layer structure is formed on the oxide layer structure. The metal structure is formed on the dielectric layer structure.

10 Claims, 5 Drawing Sheets

METAL OXIDE SEMICONDUCTOR FIELD EFFECT TRANSISTOR AND METHOD FOR MANUFACTURING THE SAME

FIELD OF THE DISCLOSURE

The present disclosure relates to a metal oxide semiconductor field effect transistor, in particular to a metal oxide semiconductor field effect transistor suitable for power supply and a method for manufacturing the same.

BACKGROUND OF THE DISCLOSURE

With the advancement of electronic technology and the trend of miniaturization of electronic products, increasingly more electronic components are produced by integrated circuit manufacturing process. However, many aspects need to be considered for integrated circuit type electronic components, such as issues of high voltage resistance, mutual interference or anti-noise, especially when being used in power supplies. Since the power supply needs to receive a high voltage input, the high voltage may cause the integrated circuit type electronic component to burn out, therefore causing the power supply to malfunction, which is the main reason that the size of the power supply cannot be reduced in the application of integrated circuit type electronic components.

Metal oxide semiconductor field effect transistors are also commonly used in power supplies. Since the operation speed of the metal oxide semiconductor field effect transistors is quite fast and the voltage signal processing performance thereof is outstanding, the metal oxide semiconductor field effect transistors can be applied as power converters. In response to the miniaturization trend of the electronic products, the metal oxide semiconductor field effect transistors have also gradually moved towards integrated circuitization. However, when the power supply receives a high voltage input, the integrated circuit type metal oxide semiconductor field effect transistor may be unable to withstand the high voltage and burn out. In addition, the conventional metal oxide semiconductor field effect transistor still has defects such as high production cost, low production yield, and large volume.

SUMMARY OF THE DISCLOSURE

In response to the above-referenced technical inadequacies, the present disclosure provides a metal oxide semiconductor field effect transistor and a method for manufacturing the same.

In one aspect, the present disclosure provides a metal oxide semiconductor field effect transistor which includes a substrate structure, a plurality of doped regions, an oxide layer structure, a plurality of semiconductor layer structures, a dielectric layer structure, and a metal structure. The substrate structure includes a base layer and an epitaxial layer formed on the base layer. The epitaxial layer has a plurality of trenches, the plurality of trenches are recessed from a surface of the epitaxial layer away from the base layer at intervals along a first direction, any two adjacent trenches form a pitch therebetween, and a plurality of pitches formed between the plurality of trenches are increased along the first direction. The plurality of doped regions are respectively formed at bottoms of the plurality of trenches and diffuse toward a portion of the epitaxial layer. The oxide layer structure includes a plurality of trench oxide layers and a cover oxide layer. The plurality of trench oxide layers are respectively formed on inner walls of the plurality of trenches, in which bottoms of the plurality of trench oxide layers respectively abut on the plurality of doped regions, and each of the trench oxide layers surrounds a groove. The cover oxide layer is formed on the surface of the epitaxial layer away from the base layer, and the cover oxide layer is extendingly connected between the plurality of trench oxide layers. The plurality of semiconductor layer structures are respectively formed in the plurality of grooves, so that the plurality of semiconductor layer structures and the plurality of trench oxide layers together form a plurality of trench-type structures. The dielectric layer structure is formed and covered on the oxide layer structure and the plurality of semiconductor layer structures. The metal structure is formed on a surface of the dielectric layer structure away from the base layer. The metal structure is electrically connected to at least one trench-type structure of the plurality of trench-type structures.

In another aspect, the present disclosure provides a method for manufacturing a metal oxide semiconductor field effect transistor, which includes: providing a substrate structure including a base layer and an epitaxial layer formed on the base layer; forming a plurality of trenches recessed in the epitaxial layer, respectively, in which the plurality of trenches are recessed from a surface of the epitaxial layer away from the base layer at intervals along a first direction, any two adjacent trenches form a pitch therebetween, and a plurality of pitches formed between the plurality of trenches are increased along the first direction; forming a plurality of doped regions at bottoms of the plurality of trenches, respectively, in which the plurality of doped regions are respectively diffused from the bottoms of the plurality of trenches toward a portion of the epitaxial layer; forming an oxide layer structure on the epitaxial layer, in which the oxide layer structure includes a plurality of trench oxide layers and a cover oxide layer, the plurality of trench oxide layers are respectively formed on inner walls of the plurality of trenches, bottoms of the plurality of trench oxide layers respectively abut on the plurality of doped regions, each of the trench oxide layers surrounds a groove, the cover oxide layer is formed on the surface of the epitaxial layer away from the base layer, and the cover oxide layer is extendingly connected between the plurality of trench oxide layers; forming a plurality of semiconductor layer structures in the plurality of grooves, respectively, so that the plurality of semiconductor layer structures and the plurality of trench oxide layers together form a plurality of trench-type structures, respectively; forming a dielectric layer structure on the oxide layer structure and the plurality of semiconductor layer structures, so that the dielectric layer structure covers the oxide layer structure and the plurality of semiconductor layer structures; and forming a metal structure on a surface of the dielectric layer structure away from the base layer, in which the metal structure is electrically connected to at least one trench-type structure of the plurality of trench-type structures.

Therefore, advantages of the present embodiment are that by virtue of "the plurality of trenches are recessed from a surface of the epitaxial layer away from the base layer at intervals along a first direction, any two adjacent trenches form a pitch therebetween, and a plurality of pitches formed between the plurality of trenches are increased along the first direction", the finally produced metal oxide semiconductor field effect transistor can have competitive advantages such as low production cost, high production yield, small volume, and simple structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
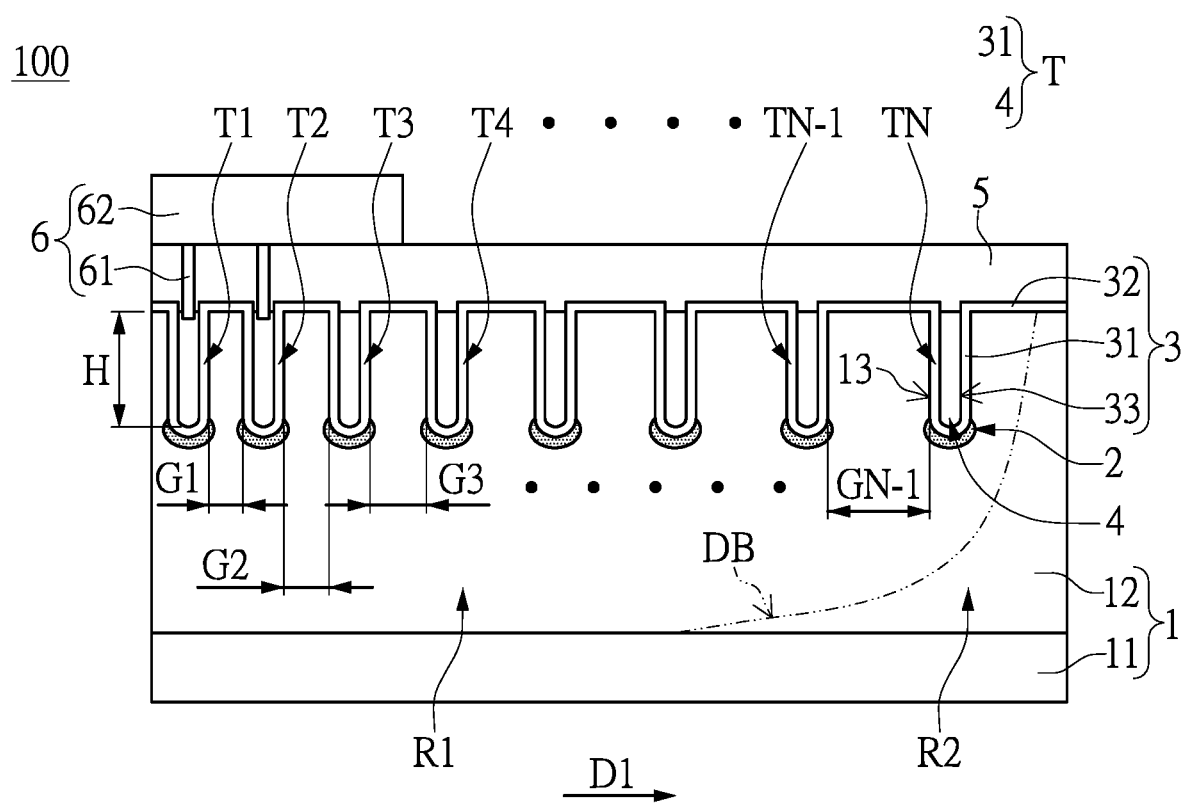
FIG. 1 is a cross-sectional view of a metal oxide semiconductor field effect transistor according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Method for Manufacturing MOSFET

Referring to FIG. 1 and FIG. 2A to FIG. 2G, an embodiment of the present disclosure provides a method for manufacturing a metal oxide semiconductor field effect transistor (abbreviated as MOSFET), which includes steps S110 to S170. In the present embodiment, the metal oxide semiconductor field effect transistor is a power element, such as a power supply or a transformer, but the present disclosure is not limited thereto. It should be noted that the order of the steps and the actual way of operation in the present embodiment can be adjusted according to requirements and are not limited to those in the present embodiment.

In the present embodiment, the method for manufacturing the metal oxide semiconductor field effect transistor is firstly described below. For ease of understanding, a unit region of the metal oxide semiconductor field effect transistor is taken as an example, and a cross-sectional view of the unit region is used for explanation. The diagram corresponding to each step can be referred to, as can the diagrams of other steps, if necessary. The specific steps of the method for manufacturing the metal oxide semiconductor field effect transistor are described below.

Figure 2A:
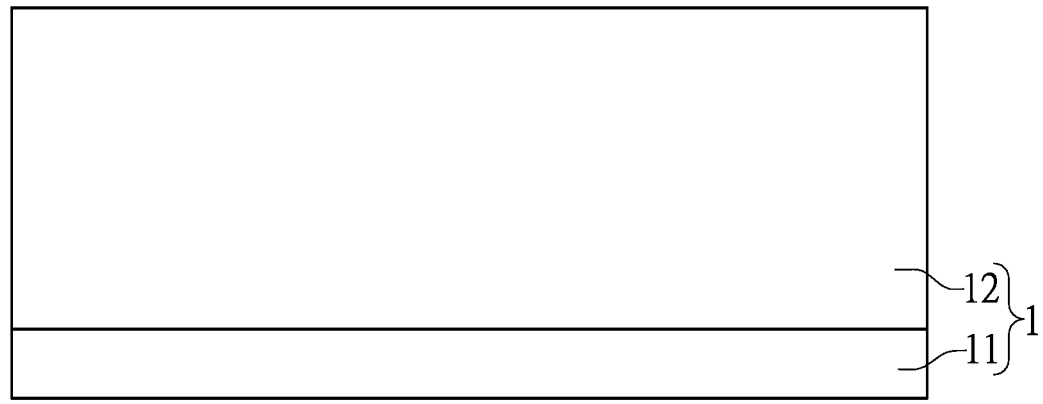
FIG. 2A is a schematic view of step S110 of a method for manufacturing the metal oxide semiconductor field effect transistor according to the embodiment of the present disclosure.

Referring to FIG. 2A, the step S110 includes: providing a substrate structure 1. The substrate structure 1 includes a base layer 11 and an epitaxial layer 12 formed on the base layer 11, in which two opposite surfaces of the substrate structure 1 are respectively defined as a top surface and a bottom surface (not labeled in the drawings). More specifically, the surface of the epitaxial layer 12 away from the base layer 11 is defined as the top surface, and the surface of the base layer 11 away from the epitaxial layer 12 is defined as the bottom surface.

Further, a material of the base layer 11 may be, for example, an N-type doped semiconductor or a P-type doped semiconductor. The epitaxial layer 12 may be formed on the base layer 11 by an epitaxial process, and a conductive type of the epitaxial layer 12 may be the same as a conductive type of the base layer 11 (i.e. N-type doping or P-type doping). In the present embodiment, the base layer 11 is an N-type doped semiconductor, and the epitaxial layer 12 is also an N-type doped semiconductor. In addition, a doping concentration of the base layer 11 is greater than that of the epitaxial layer 12, but the present disclosure is not limited thereto.

Figure 2B:
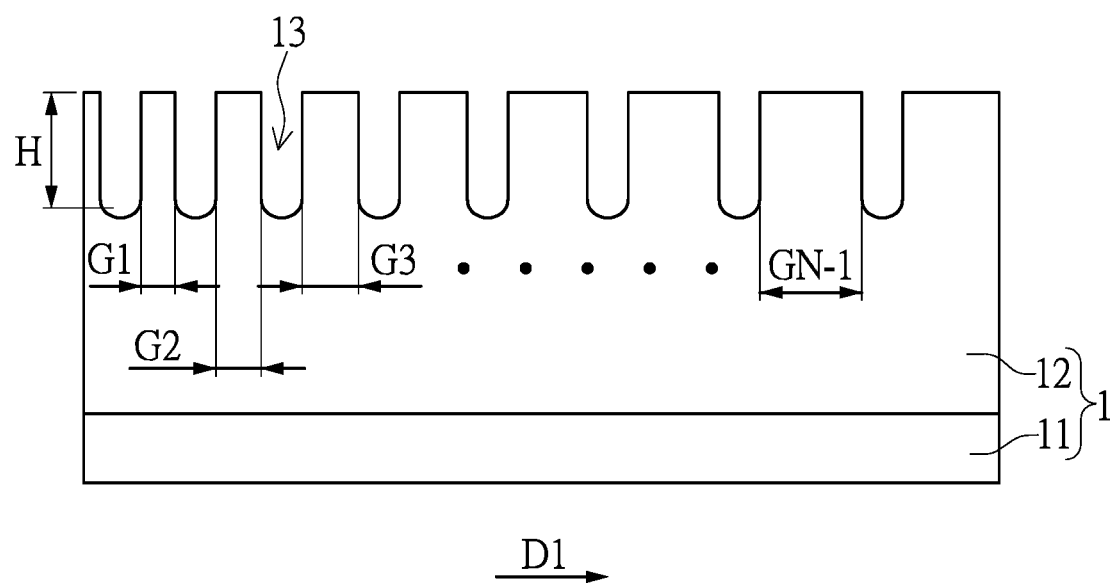
FIG. 2B is a schematic view of step S120 of the method for manufacturing the metal oxide semiconductor field effect transistor according to the embodiment of the present disclosure.

Referring to FIG. 2B, the step S120 includes: forming a plurality of trenches 13 recessed in the epitaxial layer 12, respectively. The plurality of trenches 13 may be formed by, for example, etching, but the present disclosure is not limited thereto.

More specifically, the plurality of trenches 13 are recessed from a surface of the epitaxial layer 12 away from the base layer 11 at intervals along a first direction D1. Further, the bottoms of the plurality of trenches 13 are not in contact with the base layer 11 and are spaced apart from the base layer 11 by a distance. In other words, the plurality of trenches 13 are recessed from the top surface of the base structure 1 and not in contact with the base layer 11 of the base structure 1.

Further, any two adjacent trenches 13 form a pitch therebetween, and a plurality of pitches G1~GN−1 formed between the plurality of trenches 13 are increased along the first direction D1. The number of the plurality of trenches 13 is N, and N is a positive integer greater than 3.

It is worth mentioning that, in order to enable the finally produced metal oxide semiconductor field effect transistor 100 to be suitable for receiving a higher working voltage to pass therethrough (i.e. a working voltage between 300 volts and 800 volts), the number of the plurality of trenches 13 is usually between 7 and 30, preferably between 7 and 20, and more preferably between 7 and 15. That is, the aforementioned value N is usually a positive integer between 7 and 30, preferably a positive integer between 7 and 20, and more preferably a positive integer between 7 and 15, but the present disclosure is not limited thereto.

As described above, the plurality of pitches G1~GN−1 formed between the plurality of trenches 13 are increased along the first direction D1. In an embodiment of the present disclosure, an increased amount between any two adjacent pitches is usually between 5% and 25%, and preferably between 5% and 15%. That is, in any two adjacent pitches described above, the increased amount of the last pitch compared to the previous pitch is usually between 5% and 25%. For example, in FIG. 2B, the increased amount of the second pitch G2 compared to the first pitch G1 is between 5% and 25%, and the increased amount of the third pitch G3 compared to the second pitch G2 is also between 5% and 25%.

From another perspective, in an embodiment of the present disclosure, a difference (or an absolute value of the difference) between any two adjacent pitches is usually between 0.3 micrometers and 1.2 micrometers, and preferably between 0.4 micrometers and 0.8 micrometers. That is, in any two adjacent pitches described above, the difference between the last pitch and the previous pitch is usually between 0.3 micrometers and 1.2 micrometers. For example, in FIG. 2B, the difference between the second pitch G2 and the first pitch G1 is between 0.3 micrometers and 1.2 micrometers, and the difference between the third pitch G3 and the second pitch G2 is also between 0.3 micrometers and 1.2 micrometers.

It should be noted that any two adjacent increased amounts or any two adjacent differences described above may be the same or different, and the present disclosure is not limited thereto. In a preferred embodiment of the present disclosure, any two adjacent differences described above are the same. In other words, the pitches G1~GN−1 formed between the N trenches 13 are increased in arithmetic progression or increased in equal increments along the first direction D1.

Further referring to FIG. 2B, in a specific embodiment of the present disclosure, the number of the trenches 13 is eight, and seven pitches are formed between the eight trenches 13. Among the above seven pitches, the first pitch G1 is 2.65 micrometers, the second pitch G2 is 3.25 micrometers, and the third pitch G3 is 3.85 micrometers. That is, the difference between the second pitch G2 and the first pitch G1 is 0.6 micrometers, and the difference between the third pitch G3 and the second pitch G2 is 0.6 micrometers, and so on. The above-mentioned seven pitches are increased in arithmetic progression or increased in equal increments along the first direction D1.

It should be noted that the first pitch G1 is described by taking 2.65 micrometers as an example, but the present disclosure is not limited thereto. For example, the first pitch G1 of the plurality of pitches along the first direction D1 is generally between 2 micrometers and 8 micrometers, and preferably between 3 micrometers and 6 micrometers.

Further, the distance from the bottom to the top of each trench 13 is defined as a trench depth H. That is, the distance from the bottom of each of the trenches 13 to the top surface of the substrate structure 1 is defined as the trench depth H. The trench depth H of each of the trenches 13 is generally between 4 micrometers and 20 micrometers, and preferably between 4 micrometers and 16 micrometers.

It should be noted that FIG. 2B is described by using an example in which the trench depths H of the plurality of trenches 13 are the same with each other, but the present disclosure is not limited thereto. For example, in an embodiment not shown in the present disclosure, the trench depths H of the plurality of trenches 13 may be different from each other.

In addition, it should be noted that the plurality of trenches 13 are described with respect to the trenches 13 at different locations in the epitaxial layer 12 from a sectional view angle. When viewing the MOSFET as a whole, the trenches 13 may be in communication with each other or be separate from each other, and the present disclosure is not limited thereto.

Figure 2C:
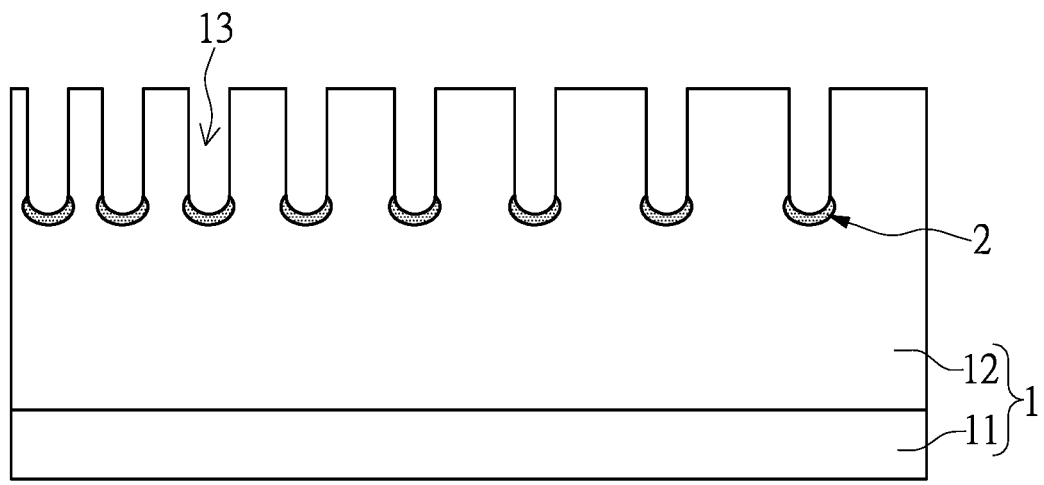
FIG. 2C is a schematic view of step S130 of the method for manufacturing the metal oxide semiconductor field effect transistor according to the embodiment of the present disclosure.

Referring to FIG. 2C, the step S130 includes: forming a plurality of doped regions 2 at the bottoms of the plurality of trenches 13, respectively. The plurality of doped regions 2 are respectively diffused from the bottoms of the plurality of trenches 13 toward a portion of the epitaxial layer 12. The plurality of doped regions 2 may be formed by an ion implantation process, but the present disclosure is not limited thereto.

That is, the bottom of each of the trenches 13 is formed with a doped region 2. Each of the doped regions 2 diffuses from the bottom of the corresponding trench 13 toward a portion of the epitaxial layer 12. Accordingly, each of the doped regions 2 surrounds the periphery of the bottom of the corresponding trench 13. In addition, in the present embodiment, each of the doped regions 2 only slightly diffuses from the bottom of the corresponding trench 13 toward the epitaxial layer 12 and is presented as a half-moon structure. Each of the doped regions 2 is not in contact with the base layer 11 and is spaced apart from the base layer 11 by a distance.

Furthermore, in the present embodiment, the conductive types of the plurality of doped regions 2 are different from the conductive types of the base layer 11 and the epitaxial layer 12. That is, the plurality of doped regions 2 of the present embodiment are P-type doped semiconductors. The implanted ion type of the doped regions 2 may be, for example, boron ions (B+).

In addition, it is worth mentioning that the plurality of doped regions 2 (P-type doped semiconductors) and the epitaxial layer 12 (N-type doped semiconductor) can be formed together as a P-N junction diode. Since the holes in the P-type semiconductor material and the electrons in the N-type semiconductor material are combined at the joint surface, the region near the joint surface lacks carriers, thereby forming a depletion region as shown in the region R1 of FIG. 1, the boundary of the depletion region being defined as a depletion boundary (DB).

Figure 2D:
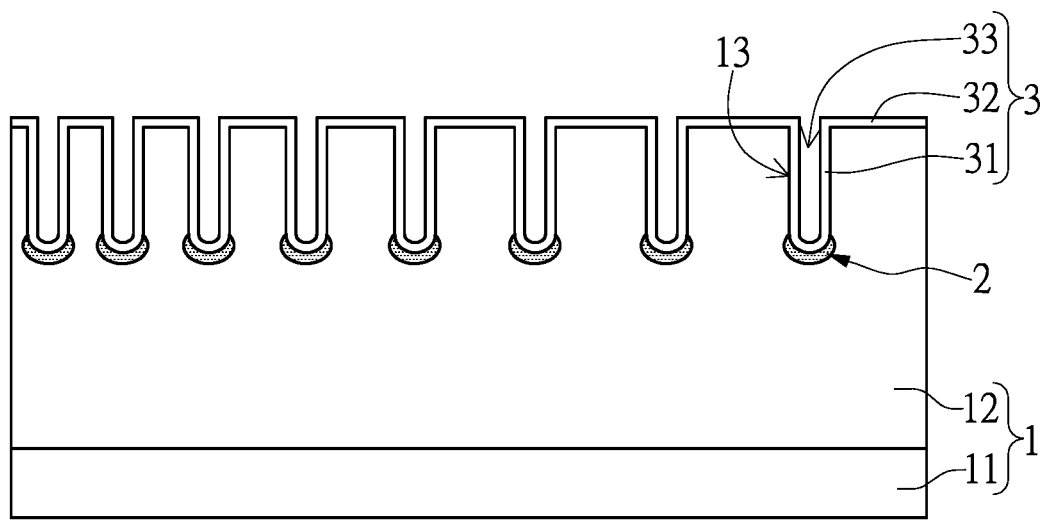
FIG. 2D is a schematic view of step S140 of the method for manufacturing the metal oxide semiconductor field effect transistor according to the embodiment of the present disclosure.

Referring to FIG. 2D, the step S140 includes: extendingly forming an oxide layer structure 3 on the surface of the epitaxial layer 12 away from the base layer 11 and the inner walls of the plurality of trenches 13. The oxide layer structure 3 may be formed by a low temperature oxide deposition (LTO deposition) process, but the present disclosure is not limited thereto.

More specifically, the oxide layer structure 3 includes a plurality of trench oxide layers 31 and a cover oxide layer 32. The plurality of trench oxide layers 31 are respectively formed on the inner walls of the plurality of trenches 13, and the bottoms of the plurality of trench oxide layers 31 respectively abut on the plurality of doped regions 2. Each of the trench oxide layers 31 surrounds a groove 33. Furthermore, the cover oxide layer 32 is formed on the surface of the epitaxial layer 12 away from the base layer 11 (i.e. the top surface of the epitaxial layer 12), and the cover oxide layer 32 is extendingly connected between the plurality of trench oxide layers 31.

The thickness of the oxide layer structure 3 of the present embodiment is approximately between 0.5 micrometers (5KÅ) and 1.5 micrometers (15KÅ). More specifically, the thickness of each of the trench oxide layers 31 is approximately between 0.5 micrometers and 1.5 micrometers. In addition, the material of the oxide layer structure 3 may be made of, for example, a silicon compound or other dielectric materials. For example, the aforementioned silicon compound may be, for example, silicon dioxide or silicate, and is preferably silicon dioxide, but the present disclosure is not limited thereto.

Figure 2E:
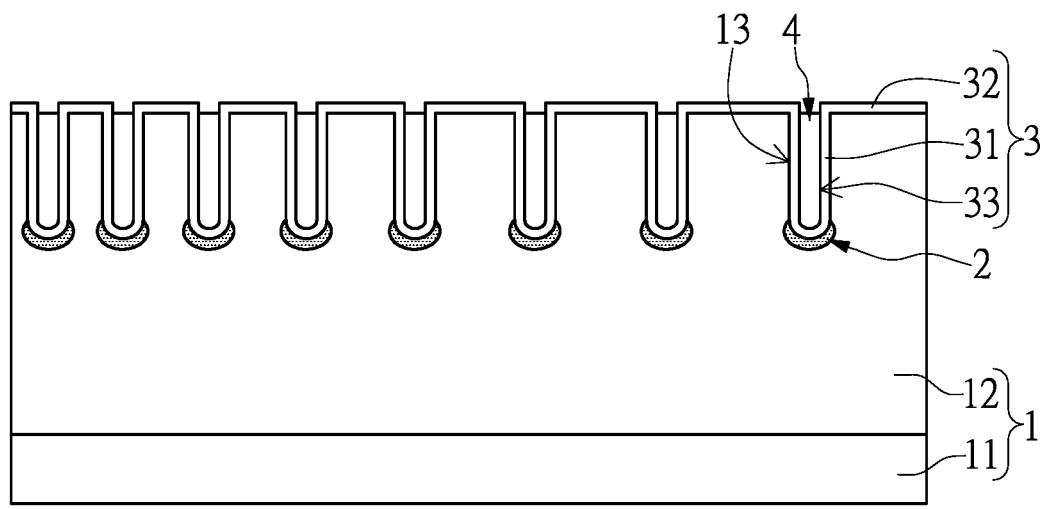
FIG. 2E is a schematic view of step S150 of the method for manufacturing the metal oxide semiconductor field effect transistor according to the embodiment of the present disclosure.

Referring to FIG. 2E, which is to be read in conjunction with FIG. 1, the step S150 includes: respectively forming a plurality of semiconductor layer structures 4 in the plurality of grooves 33 that are surrounded by the plurality of trench oxide layers 31, so that the plurality of semiconductor layer structures 4 and the plurality of trench oxide layers 31 together form a plurality of trench-type structures T.

Further, the plurality of semiconductor layer structures 4 may be subjected to an etch-back step, so that a height of the exposed outer surfaces of the semiconductor layer structures 4 (i.e. the top surfaces of the semiconductor layer structures 4 in FIG. 2E) are lower than a height of the outer surface of the cover oxide layer 32 (i.e. the surface of the cover oxide layer 32 away from the epitaxial layer 12 in FIG. 2E), but the present disclosure is not limited thereto. Moreover, the material of the plurality of semiconductor layer structures 4 may be, for example, doped polysilicon, but the present disclosure is not limited thereto.

Figure 2F:
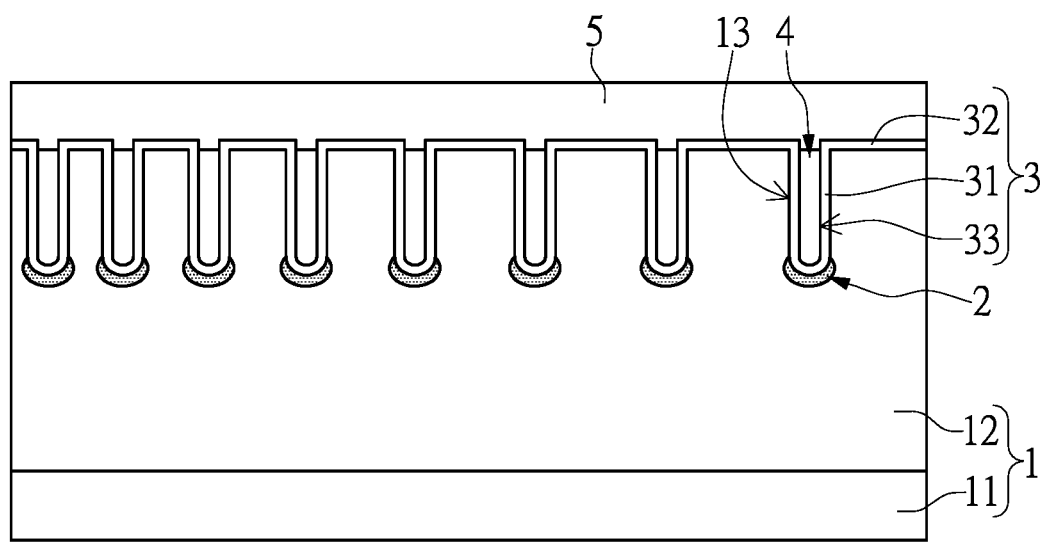
FIG. 2F is a schematic view of step S160 of the method for manufacturing the metal oxide semiconductor field effect transistor according to the embodiment of the present disclosure.

Referring to FIG. 2F, the step S160 includes: forming and covering a dielectric layer structure 5 (interlayer dielectric, ILD) on the oxide layer structure 3 and the plurality of semiconductor layer structures 4, so that the oxide layer structure 3 and the plurality of semiconductor layer structures 4 are embedded in the dielectric layer structure 5. The dielectric layer structure 5 may be formed by, for example, a chemical vapor deposition method, but the present disclosure is not limited thereto. The dielectric layer structure 5 may also be formed by, for example, a physical vapor deposition method or other suitable deposition processes. Furthermore, the material of the dielectric layer structure 5 may be made of, for example, a silicon compound or other dielectric materials.

In addition, the outer surface of the dielectric layer structure 5 may be planarized by a chemical mechanical polishing (CMP) process, but the present disclosure is not limited thereto.

Figure 2G:
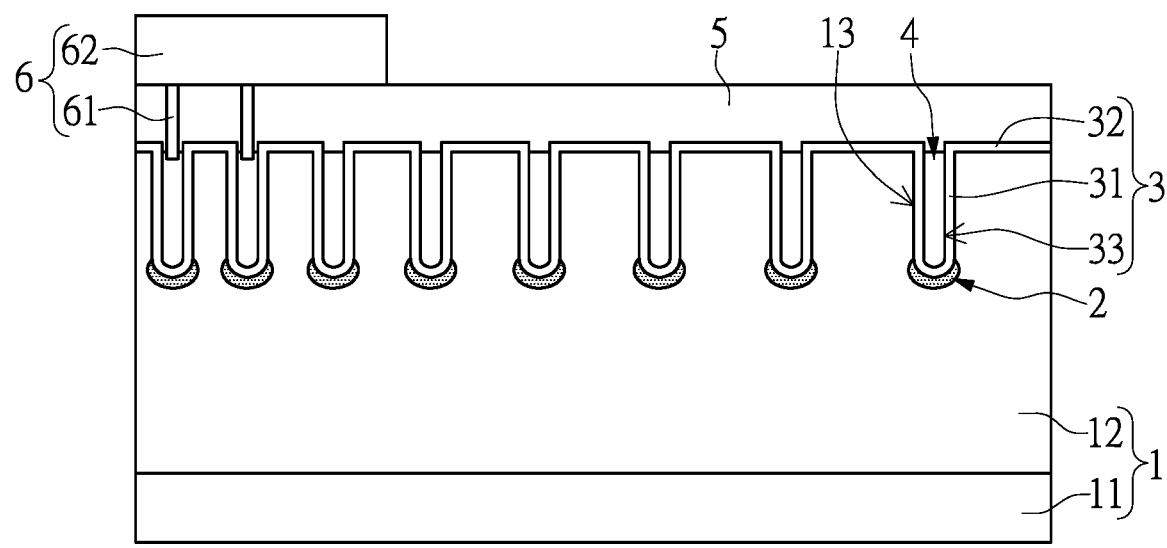
FIG. 2G is a schematic view of step S170 of the method for manufacturing the metal oxide semiconductor field effect transistor according to the embodiment of the present disclosure.

Referring to FIG. 2G, which is to be read in conjunction with FIG. 1, the step S170 includes: forming a metal structure 6 on a surface of the dielectric layer structure 5 away from the base layer 11 to form the metal oxide semiconductor field effect transistor 100. The metal structure 6 partially penetrates through the dielectric layer structure 5 and is electrically connected to at least one trench-type structure of the plurality of trench-type structures T1~TN. The metal structure 6 may be formed, for example, by a deposition method, and in the present embodiment, the metal structure 6 is an integrated structure formed of an aluminum-silicon-copper alloy. However, in practical applications, the present disclosure is not limited thereto.

Further, the metal structure 6 includes a conductive portion 62 and two contact plugs 61 integrally formed with the conductive portion 62. The conductive portion 62 is formed on the surface of the dielectric layer structure 5 away from the base layer 11. The two contact plugs 61 are spaced apart from each other. The two contact plugs 61 respectively penetrate through the dielectric layer structure 5. Accordingly, the conductive portion 62 can be electrically connected to two adjacent trench-type structures T1 and T2 of the plurality of trench-type structures T1~TN through the two contact plugs 61, respectively. In addition, a width of each of the contact plugs 61 is less than a width of the corresponding trench-type structure T and a width of the corresponding trench 13.

More specifically, the two contact plugs 61 are respectively formed through the dielectric layer structure 5, and the two contact plugs 62 partially extend into the semiconductor layer structure 4 of the first trench-type structure T1 and the semiconductor layer structure 4 of the second trench-type structure T2, respectively. Accordingly, the conductive portion 62 can be electrically connected to the first trench-type structure T1 and the second trench-type structure T2 of the plurality of trench-type structures T1~TN through the two contact plugs 61 (as shown in FIG. 1), and the semiconductor layer structure 4 of the first trench-type structure T1 and the semiconductor layer structure 4 of the second trench-type structure T2 are equipotential compared to the two contact plugs 61 to which they are electrically connected.

It is worth mentioning that although the present embodiment is described by taking the two contact plugs 61 as an example, the present disclosure is not limited thereto. For example, in another embodiment of the present disclosure, the number of the contact plugs 61 may also be one or three or more according to the design requirements of the product.

Furthermore, in the present embodiment, the conductive portion 62 covers only a part of the outer surface of the dielectric layer structure 5, and the other part of the outer surface of the dielectric layer structure 5 is exposed to the outside.

It is worth mentioning that before the metal structure 6 is formed, the manufacturing method of the present embodiment further includes: forming two contact grooves (not labeled in the drawings) recessed in the dielectric layer structure 5 by means of etching to provide for the two aforementioned contact plugs 61 to be respectively formed therein.

After implementing the above steps S110 to S170, the metal oxide semiconductor field effect transistor 100 (also referred to as a trench-type power element) shown in FIG. 1 can be completed, but in practical applications, each step may be substituted with a reasonable variation. Furthermore, it should be noted that the above steps are described from the perspective of a sectional view. Under the premise that conditions in the above steps are met, the possibility of implementing the present disclosure in various design layouts is not excluded. In other words, if viewed from a top view, the metal oxide semiconductor field effect transistor of the present disclosure may have different design layouts.

Metal Oxide Semiconductor Field Effect Transistor

The method for manufacturing the metal oxide semiconductor field effect transistor according to the embodiment of the present disclosure has been described above. The specific structure of the metal oxide semiconductor field effect transistor 100 of the present embodiment will be described below. It should be noted that although the metal oxide semiconductor field effect transistor 100 of the present embodiment is manufactured by the above-mentioned manufacturing method, the present disclosure is not limited thereto. That is, the metal oxide semiconductor field effect transistor of the present disclosure may be produced by other methods for manufacturing the transistor.

As shown in FIG. 1, the present embodiment further discloses a metal oxide semiconductor field effect transistor 100, which includes a substrate structure 1, a plurality of doped regions 2, an oxide layer structure 3, a plurality of semiconductor layer structures 4, a dielectric layer structure 5 and a metal structure 6.

The substrate structure 1 includes a base layer 11 and an epitaxial layer 12. The epitaxial layer 12 is formed on the base layer 11. The epitaxial layer 12 forms a plurality of trenches 13, and the plurality of trenches 13 are recessed from a surface of the epitaxial layer 12 away from the base layer 11 at intervals along a first direction D1. Further, any two adjacent trenches 13 form a pitch G therebetween, and a plurality of pitches G1~GN−1 formed between the plurality of trenches 13 are increased along the first direction D1.

The plurality of doped regions 2 are respectively formed at bottoms of the plurality of trenches 13, and the plurality of doped regions 2 diffuse toward a portion of the epitaxial layer 12.

The oxide layer structure 3 includes a plurality of trench oxide layers 31 and a cover oxide layer 32. The plurality of trench oxide layers 31 are respectively formed on the inner walls of the plurality of trenches 13, and the bottoms of the plurality of trench oxide layers 31 respectively abut on the plurality of doped regions 2. Each of the trench oxide layers 31 surrounds a groove 33. Furthermore, the cover oxide layer 32 is formed on the surface of the epitaxial layer 12 away from the base layer 11, and the cover oxide layer 32 is extendingly connected between the plurality of trench oxide layers 31.

The plurality of semiconductor layer structures 4 are respectively formed and filled in the plurality of grooves 33, and the plurality of semiconductor layer structures 4 and the plurality of trench oxide layers 31 together form a plurality of trench-type structures T1~TN.

The dielectric layer structure 5 is formed and covered on the oxide layer structure 3 and the plurality of semiconductor layer structures 4.

The metal structure 6 is formed on a surface of the dielectric layer structure 5 away from the base layer 11. The metal structure 6 partially penetrates through the dielectric layer structure 5, so that the metal structure 6 is electrically connected to at least one trench-type structure of the plurality of trench-type structures T1~TN.

It is worth mentioning that, as described in the above embodiment, the number of the plurality of trenches 13 is N, and the number of the plurality of trench-type structures T corresponds to the number of the plurality of trenches 13, all of which are N. In addition, the number of the plurality of pitches G1~GN−1 formed between the plurality of trenches 13 is N−1. That is, the number of the plurality of pitches G1~GN−1 is N−1.

The N trench-type structures T are sequentially defined as a first trench-type structure T1, a second trench-type structure T2, a third trench-type structure T3, a fourth trench-type structure T4, . . . , N−1th trench-type structure TN−1, and Nth trench-type structure TN along the first direction D1. In addition, the N−1 pitches G are sequentially defined as a first pitch G1, a second pitch G2, a third pitch G3, . . . , and N−1th pitch GN−1 along the first direction D1. The above-mentioned numerical value N is usually a positive integer between 7 and 30, preferably a positive integer between 7 and 20, and more preferably a positive integer between 7 and 15. In the present embodiment, the above-mentioned numerical value N is 8, but the present disclosure is not limited thereto.

More specifically, the first pitch G1 is a pitch formed between the first trench-type structure T1 and the second trench-type structure T2. The second pitch G2 is a pitch formed between the second trench-type structure T2 and the third trench-type structure T3. The third pitch G3 is a pitch formed between the third trench-type structure T3 and the fourth trench-type structure T4. In addition, the N−1th pitch GN−1 is a pitch formed between the N−1th trench-type structure TN−1 and the Nth trench-type structure TN, and so on.

According to the design of the pitches between the plurality of trench-type structures, the metal oxide semiconductor field effect transistor 100 is formed with a depletion boundary DB, and the depletion boundary DB extends from a top surface of the epitaxial layer 12 to a bottom surface of the epitaxial layer 12, so that the epitaxial layer 12 is divided into a first region R1 and a second region R2. The first region R1 and the second region R2 are sequentially arranged along the first direction D1, and the plurality of trench-type structures T1~TN are all located on a side of the depletion boundary DB and completely located inside the first region R1. In other words, the depletion boundary DB is located on the rear side of the Nth trench-type structure TN of the plurality of trench-type structures T1~TN along the first direction D1. Accordingly, when the metal oxide semiconductor field effect transistor 100 of the present embodiment is being cut, the transistor can be cut from the second region R2.

It is worth mentioning that in FIG. 1, the above-mentioned depletion boundary DB is an arc curve. Furthermore, the first region R1 may be referred as a depletion region, the second region R2 may be referred as a neutral region, and an area of the depletion region R1 is greater than that of the neutral region R2.

Accordingly, the metal oxide semiconductor field effect transistor 100 of the present embodiment is suitable for receiving a working voltage between 300 volts and 800 volts to pass therethrough, and the metal oxide semiconductor field effect transistor 100 can operate normally without being burned. The working voltage is preferably between 500 volts and 700 volts.

According to the above configuration, the metal oxide semiconductor field effect transistor 100 of the present embodiment has competitive advantages such as low production cost, high production yield, small volume, and simple structure. The metal oxide semiconductor field effect transistor 100 of the present embodiment is particularly suitable for a power supply or a transformer of 300 volts to 650 volts. The width of the metal oxide semiconductor field effect transistor 100 of the present embodiment along the first direction D1 can be reduced to a size of not greater than 120 micrometers (preferably not greater than 100 micrometers). The transistor 100 has a volume reduced by 30% to 50% compared with the conventional products of the same specifications.

Advantages of the Embodiment

In conclusion, advantages of the present embodiment are that by virtue of "the plurality of trenches are recessed from a surface of the epitaxial layer away from the base layer at intervals along a first direction, any two adjacent trenches form a pitch therebetween, and a plurality of pitches formed between the plurality of trenches are increased along the first direction", the finally produced metal oxide semiconductor field effect transistor can have competitive advantages such as low production cost, high production yield, small volume, and simple structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A metal oxide semiconductor field effect transistor, comprising:
   a substrate structure which includes:
      a base layer; and
      an epitaxial layer formed on the base layer; wherein the epitaxial layer has a plurality of trenches, the plurality of trenches are recessed from a surface of the epitaxial layer away from the base layer at intervals along a first direction, any two adjacent trenches form a pitch therebetween, and a plurality of pitches formed between the plurality of trenches are increased along the first direction;
   a plurality of doped regions respectively formed at bottoms of the plurality of trenches and diffusing toward a portion of the epitaxial layer;
   an oxide layer structure which includes:
      a plurality of trench oxide layers respectively formed on inner walls of the plurality of trenches; wherein bottoms of the plurality of trench oxide layers respectively abut on the plurality of doped regions, and each of the trench oxide layers surrounds a groove;
      a cover oxide layer formed on the surface of the epitaxial layer away from the base layer, wherein the cover oxide layer is extendingly connected between the plurality of trench oxide layers;
   a plurality of semiconductor layer structures respectively formed in the plurality of grooves, so that the plurality of semiconductor layer structures and the plurality of trench oxide layers together form a plurality of trench-type structures;
   a dielectric layer structure formed and covered on the oxide layer structure and the plurality of semiconductor layer structures; and
   a metal structure formed on a surface of the dielectric layer structure away from the base layer; wherein the metal structure is electrically connected to at least one trench-type structure of the plurality of trench-type structures.

2. The metal oxide semiconductor field effect transistor according to claim 1, wherein the number of the plurality of trenches is N, and N is a positive integer greater than 3; wherein an increased amount between any two adjacent pitches is between 5% and 25%.

3. The metal oxide semiconductor field effect transistor according to claim 1, wherein the number of the plurality of trenches is N, and N is a positive integer greater than 3; wherein a difference between any two adjacent pitches is between 0.3 micrometers and 1.2 micrometers.

4. The metal oxide semiconductor field effect transistor according to claim 1, wherein the number of the plurality of trenches is N, and N is a positive integer greater than 3; wherein the pitches formed between the N trenches are increased in arithmetic progression along the first direction.

5. The metal oxide semiconductor field effect transistor according to claim 1, wherein the number of the plurality of trench-type structures corresponds to the number of the plurality of trenches, all of which are N; wherein the number of the plurality of pitches is N−1, the N trench-type structures are sequentially defined as a first trench-type structure to an N-th trench-type structure along the first direction, and the N−1 pitches are sequentially defined as a first pitch to an N−1th pitch along the first direction; wherein N is a positive integer between 7 and 30.

6. The metal oxide semiconductor field effect transistor according to claim 5, wherein the metal structure includes a conductive portion and at least one contact plug; wherein the conductive portion is formed on a surface of the dielectric layer structure away from the base layer, and the at least one contact plug penetrates through the dielectric layer structure, so that the conductive portion is electrically connected to one trench-type structure of the plurality of trench-type structures through the at least one contact plug.

7. The metal oxide semiconductor field effect transistor according to claim 6, wherein the number of the at least one contact plugs is two, the two contact plugs respectively penetrate through the dielectric layer structure, the two contact plugs partially extend into the semiconductor layer structure of the first trench-type structure and the semiconductor layer structure of the second trench-type structure, respectively, so that the conductive portion is electrically connected to the first trench-type structure and the second trench-type structure of the plurality of trench-type structures through the two contact plugs, respectively.

8. The metal oxide semiconductor field effect transistor according to claim 1, wherein each of the trenches has a trench depth between 4 micrometers and 20 micrometers.

9. The metal oxide semiconductor field effect transistor according to claim 1, wherein the metal oxide semiconductor field effect transistor is formed with a depletion boundary, and the depletion boundary extends from a top surface of the epitaxial layer to a bottom surface of the epitaxial layer, so that the epitaxial layer is divided into a first region and a second region; wherein the first region and the second region are sequentially arranged along the first direction, and the plurality of trench-type structures are all located on one side of the depletion boundary and completely located inside the first region.

10. A method for manufacturing a metal oxide semiconductor field effect transistor, comprising:
   providing a substrate structure which includes a base layer and an epitaxial layer formed on the base layer;

forming a plurality of trenches recessed in the epitaxial layer, respectively; wherein the plurality of trenches are recessed from a surface of the epitaxial layer away from the base layer at intervals along a first direction, any two adjacent trenches form a pitch therebetween, and a plurality of pitches formed between the plurality of trenches are increased along the first direction;

forming a plurality of doped regions at bottoms of the plurality of trenches, respectively; wherein the plurality of doped regions are respectively diffused from the bottoms of the plurality of trenches toward a portion of the epitaxial layer;

forming an oxide layer structure on the epitaxial layer; wherein the oxide layer structure includes a plurality of trench oxide layers and a cover oxide layer; wherein the plurality of trench oxide layers are respectively formed on inner walls of the plurality of trenches, bottoms of the plurality of trench oxide layers respectively abut on the plurality of doped regions, and each of the trench oxide layers surrounds a groove; wherein the cover oxide layer is formed on the surface of the epitaxial layer away from the base layer, and the cover oxide layer is extendingly connected between the plurality of trench oxide layers;

forming a plurality of semiconductor layer structures in the plurality of grooves, respectively, so that the plurality of semiconductor layer structures and the plurality of trench oxide layers together form a plurality of trench-type structures, respectively;

forming a dielectric layer structure on the oxide layer structure and the plurality of semiconductor layer structures, so that the dielectric layer structure covers the oxide layer structure and the plurality of semiconductor layer structures; and forming a metal structure on a surface of the dielectric layer structure away from the base layer; wherein the metal structure is electrically connected to at least one trench-type structure of the plurality of trench-type structures.

\* \* \* \* \*